(12) United States Patent
Liu (10) Patent No.: US 8,368,367 B2
(45) Date of Patent: Feb. 5, 2013

(54) VOLTAGE DIVIDER CIRCUIT AND VOLTAGE REGULATOR

(75) Inventor: Yi-Heng Liu, Taipei (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 287 days.

(21) Appl. No.: 12/967,061

(22) Filed: Dec. 14, 2010

(65) Prior Publication Data

US 2012/0146601 A1 Jun. 14, 2012

(51) Int. Cl.
*G05F 1/00* (2006.01)

(52) U.S. Cl. .................... 323/281; 323/273; 323/313

(58) Field of Classification Search .................. 323/271, 323/273, 281, 311, 312, 313, 314; 327/538, 327/539, 540, 541

See application file for complete search history.

(56) References Cited

U.S. PATENT DOCUMENTS

| 7,977,932 B2* | 7/2011 | Morishita | 323/314 |
| 8,217,635 B2* | 7/2012 | Nonis et al. | 323/273 |
| 2003/0052656 A1* | 3/2003 | Butler et al. | 323/273 |
| 2004/0012378 A1* | 1/2004 | Sato | 323/313 |

* cited by examiner

*Primary Examiner* — Nguyen Tran
(74) *Attorney, Agent, or Firm* — Jianq Chyun IP Office (57) ABSTRACT

The invention provides a voltage regulator including a voltage divider and a power supply. The voltage divider circuit includes a first, second, third PMOS transistors, a first NMOS transistor, a pull down circuit, and a switching capacitor circuit. The pull down circuit includes a plurality of switches controlled by a pull down control signal. The switching capacitor circuit controlled by a first control pulse includes a capacitor and provides the capacitor connected to the dividing voltage for a short period while the power supply starts up to provide the input voltage. The power supply includes a comparator and a power voltage switch. The comparator compares the dividing voltage and a reference voltage and outputs a comparison result correspondingly. The power voltage switch is controlled by the comparison result to provide the input voltage from a power voltage.

7 Claims, 7 Drawing Sheets

VOLTAGE DIVIDER CIRCUIT AND VOLTAGE REGULATOR

BACKGROUND OF THE INVENTION

1. Field of Invention

The present invention generally relates to a voltage divider circuit and a voltage regulator having the voltage divider circuit, and more particularly to a voltage divider circuit with a fast rising speed and low current consumption.

2. Description of Prior Art

Along with the rapid development of science and technology at the present, semiconductor memories, such as major storage devices for large amount of data, are being developed to have larger and larger capacity. As the semiconductor technology is continuously scaled down to achieve high memory density, on-chip voltage regulators providing lower supply voltage for internal circuits are required to fulfill the requirements for device reliability and low power consumption. For the Dynamic Random Access Memory (DRAM), the bit line sensing, restoring and pre-charge operations in the memory cell arrays consume current abruptly and heavily. For high density DRAM chip, it is challenging to design on-chip voltage regulators for memory cell arrays providing a stable voltage level with sufficient and appropriate supplying current.

Figure 1:
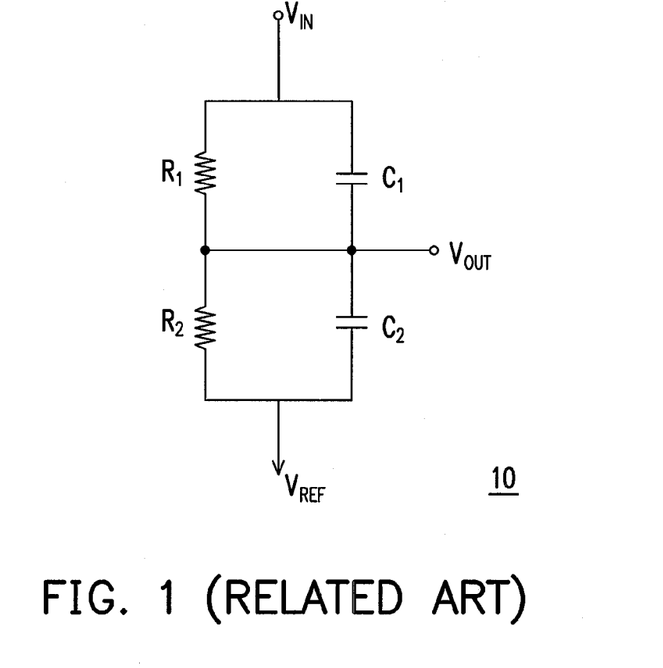
FIG. 1 is a circuit diagram of a voltage divider circuit.

Referring to FIG. 1, FIG. 1 is a circuit diagram of a voltage divider circuit. The voltage divider circuit 10 comprises two resistors $R_1$, $R_2$, and two capacitors $C_1$, $C_2$. The first ends of the resistor $R_1$ and capacitor $C_1$ are coupled to an input voltage end of the voltage divider circuit 10, wherein the input voltage end receives the input voltage $V_{IN}$ from a power supply. The second ends of the resistor $R_1$ and capacitor $C_1$ are coupled to an output voltage end of the voltage divider circuit 10, and the first ends of the resistor $R_2$ and capacitor $C_2$ are also coupled to an output voltage end of the voltage divider circuit 10, wherein the output voltage end outputs the dividing voltage $V_{OUT}$. The second ends of the resistor $R_2$ and capacitor $C_2$ are also coupled to a referencing voltage end of the voltage divider circuit 10, wherein the referencing voltage end is coupled to a referencing voltage $V_{REF}$, and the referencing voltage $V_{REF}$ can be ground.

However, the power supply for the voltage divider circuit 10 can not be shut down due to the slow rising speed of the voltages on the resistors $R_1$, $R_2$, and thus the undesired current consumption in standby mode is always keeping. To put it concretely, the large resisting values of the resistors $R_1$, $R_2$ cause the large RC constants, and thus dramatically decreasing the rising speed of the voltages on the resistors $R_1$, $R_2$. Therefore, a circuit for increasing the rising speed of the voltage divider circuit 10 without the current consumptions should be provided.

SUMMARY OF THE INVENTION

The present invention provides a voltage regulator comprising a voltage divider and a power supply. The voltage divider circuit comprises a first, second, third PMOS transistors, a first NMOS transistor, a pull down circuit, and a switching capacitor circuit. A source of first PMOS transistor is coupled to an input voltage from a power supply, and a gate of first PMOS transistor is coupled to a drain of first PMOS transistor. A source of the second PMOS transistor is coupled to the drain of the first PMOS transistor, and a gate of the second PMOS transistor is coupled to a drain of the second PMOS transistor. A source of the third PMOS transistor is coupled to the drain of the second PMOS transistor, a gate of the third PMOS transistor is coupled to a drain of the third PMOS transistor, and the drain of the third PMOS transistor is coupled to a referencing voltage. A source of the first NMOS transistor is coupled to a drain thereof, a gate of the first NMOS transistor is coupled to the source of the first PMOS transistor, and the drain of the first NMOS transistor provides a dividing voltage. The pull down circuit comprises a plurality of switches controlled by a pull down control signal, and provides a ground connected to the sources of the first, second, and third PMOS transistors when the power supply is disabled to provide the input voltage. The switching capacitor circuit controlled by a first control pulse comprises a capacitor, and provides the capacitor connected to the dividing voltage for a short period while the power supply starts up to provide the input voltage. The power supply comprises a comparator and a power voltage switch. The comparator compares the dividing voltage and a reference voltage, and outputs a comparison result correspondingly. The power voltage switch is controlled by the comparison result to provide the input voltage from a power voltage.

Accordingly, the voltage divider circuit provided by the present invention has fast rising speed of the dividing voltage when an activating mode of the voltage divider circuit starts up, and thus the power supply for the voltage divider circuit can be shut down when the input voltage from the voltage divider circuit is not needed by the voltage divider circuit in a standby mode, so as to saving the undesired current consumption in the standby mode.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiment of the invention, examples of which are illustrated in the accompanying drawings. Wherever possible, the same reference numbers are used in the drawings and the description to refer to the same or like parts.

Figure 2:
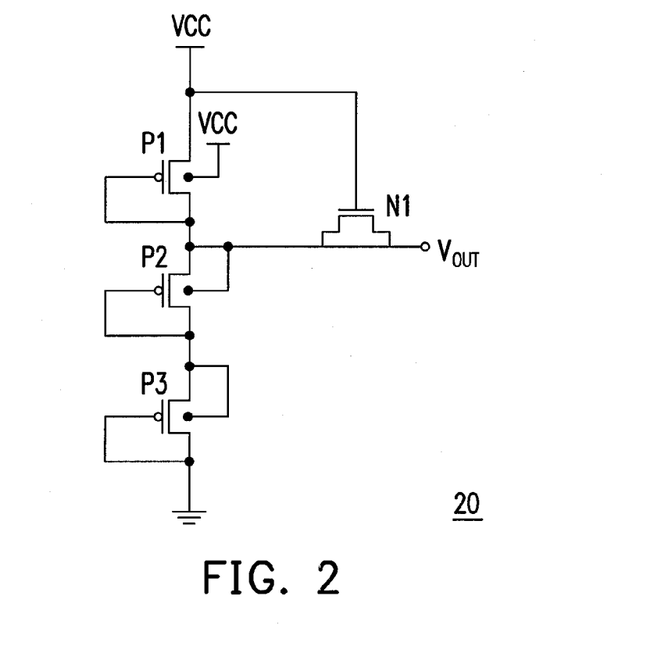
FIG. 2 is a circuit diagram of a voltage divider circuit according to an embodiment of the present invention.

Referring to FIG. 2, FIG. 2 is a circuit diagram of a voltage divider circuit according to an embodiment of the present invention. The voltage divider circuit 20 comprises multiple PMOS transistors P1-P3 and a NMOS transistor N1. A source and body of the PMOS transistor P1 is coupled to an input voltage VCC from a power supply, and a gate of the PMOS transistor P1 is coupled to a drain of the PMOS transistor P1. A source and body of the PMOS transistor P2 is coupled to the drain of the PMOS transistor P1, and a gate of the PMOS transistor P2 is coupled to a drain of the PMOS transistor P2. A source and body of the PMOS transistor P3 is coupled to the drain of the PMOS transistor P2, a gate of the PMOS transistor P3 is coupled to a drain of the PMOS transistor P3, and the drain of the PMOS transistor P3 is coupled to a referencing voltage, such as a ground. A source of the NMOS transistor N1 is coupled to a drain of the NMOS transistor N1, a gate of the NMOS transistor N1 is coupled to the source of the PMOS transistor P1, and the drain of the NMOS transistor N1 provides a dividing voltage $V_{OUT}$.

The PMOS transistors P1-P3 form multiple resistors serial connected, and the NMOS transistor N1 forms a capacitor. The power supply for the voltage divider circuit 20 can be shut down when the dividing voltage $V_{OUT}$ is not needed in a standby mode, and the dividing voltage can be fast raise when an activating mode starts up.

Figure 3:
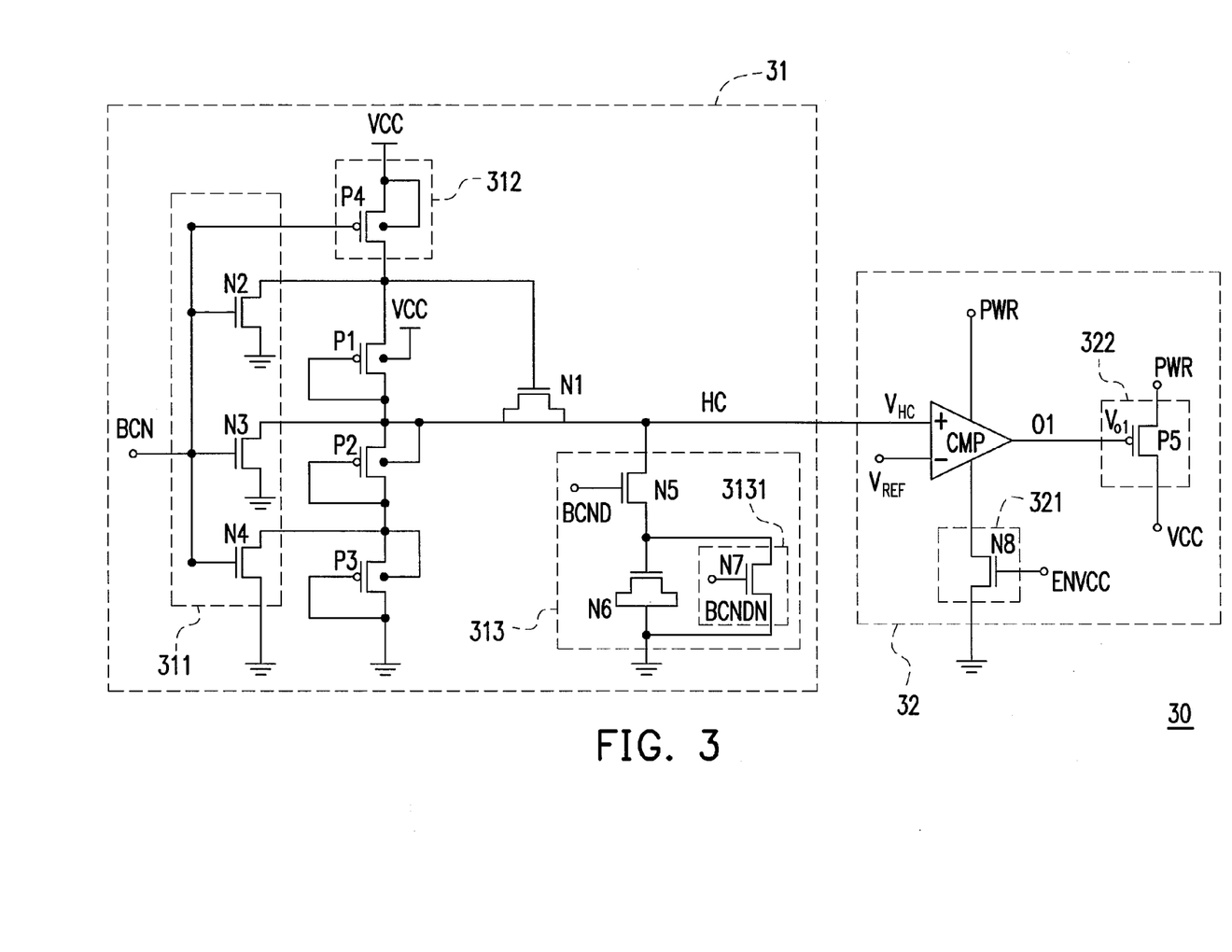
FIG. 3 is a circuit diagram of voltage regulator according to an embodiment of the present invention.

Referring to FIG. 3, FIG. 3 is a circuit diagram of voltage regulator according to an embodiment of the present invention. The voltage regulator comprises a voltage divider circuit 31 and a power supply 32. The voltage divider circuit 31 is similar to the voltage divider circuit 20 shown in FIG. 2, but additionally comprises a pull down circuit 311, an enable switch 312, and a switching capacitor circuit 313. Thus the similar description related to the PMOS transistors P1-P3 and the NMOS transistor N1 is omitted. The power supply 32 comprises a comparator CMP, a comparator enable switch 321, and a power voltage switch 322.

The pull down circuit 311 comprises a plurality of switches (implemented by multiple NMOS transistors N2-N4) controlled by a pull down control signal BCN, and provides the ground connected to the sources of the PMOS transistors P1-P3 when the power supply 32 is disabled to provide the input voltage VCC. The enable switch 312 controlled by the pull down control signal BCN provides the input voltage VCC connected to the source of the PMOS transistor P1 when the power supply 32 is disabled to provide the input voltage VCC. The switching capacitor circuit 313 controlled by a control pulse BCND comprises a capacitor (implemented by a NMOS transistor N6), and provides the capacitor connected to the dividing voltage $V_{HC}$ for a short period ($t_{PULSE}$ shown in FIG. 5) while the power supply 32 starts up to provide the input voltage VCC in the activating mode from the standby mode. The enable switch 312 is not the essential element and can be removed from the embodiment.

The comparator CMP compares the dividing voltage $V_{HC}$ and a reference voltage $V_{REF}$, and outputs a comparison result $V_{o1}$ at a node o1 correspondingly. The power voltage switch 322 is controlled by the comparison result $V_{o1}$ to provide the input voltage VCC from a power voltage PWR. The comparator enable switch 321 is controlled by a power supply enable signal ENVCC to provide the ground connected to the comparator CMP. The comparator CMP is driven by the power voltage PWR, and if the comparator enable switch 321 is turned off, the comparator CMP will be turned off to saving the power consumption. The comparator enable switch 321 is not the essential element and can be removed from the embodiment.

In the embodiment, the power voltage switch 322 is a power PMOS transistor P5, and the comparator enable switch 321 is a NMOS transistor N8. The positive input end of the comparator CMP receives the dividing voltage $V_{HC}$, a negative input end the comparator CMP receives the reference voltage $V_{REF}$. A source of the power PMOS transistor P5 is coupled to the power voltage PWR, a drain of the power PMOS transistor P5 is coupled to the input voltage VCC, and a gate of the power PMOS transistor is coupled to the comparison result $V_{o1}$. A gate of the NMOS transistor N8 is coupled to the power supply enable signal ENVCC, a drain of the NMOS transistor N8 is coupled to the comparator CMP, and a source of the NMOS transistor N8 is coupled to the ground.

The enable switch is a PMOS transistor P4, a gate of the PMOS transistor P4 is coupled to the pull down control signal BNC, a source of the PMOS transistor P4 is coupled to the input voltage VCC, and a drain of the PMOS transistor P4 is coupled to the source of the PMOS transistor P1. The pull down circuit comprises multiple NMOS transistors N2-N4. Gates of the NMOS transistors N2-N4 are coupled to the pull down control signal BCN, sources of the NMOS transistors N2-N4 are coupled to the ground, and drains of the NMOS transistors N2-N4 are respectively coupled to the sources of the PMOS transistors P1-P3. The switching capacitor circuit 313 comprises NMOS transistor N5, N6, and a small signal enhancing switch 3131. A gate of the NMOS transistor N5 is coupled to the control pulse BCND, and a drain of the NMOS transistor N5 is coupled to the dividing voltage $V_{HC}$. The NMOS transistor N6 forms the capacitor of the switching capacitor circuit 313. A gate of the NMOS transistor N6 is coupled to a source of the NMOS transistor N5, a source of the NMOS transistor N6 is coupled to a drain of NMOS transistor N6, and the source and drain of NMOS transistor N6 are coupled to the ground. The small signal enhancing switch 3131 controlled by a control pulse BCNDN to provide the ground connected to the source of the NMOS transistor N5, wherein the control pulse BCNDN is an inversion of the control pulse BCND. In the embodiment of the small signal enhancing switch 3131 is a NMOS transistor N7, a gate of the NMOS transistor N7 is coupled to the control pulse BCNDN, a source of the NMOS transistor N7 is coupled to the ground, and a drain of the NMOS transistor N7 is coupled to the source of the NMOS transistor N5. The small signal enhancing switch 3131 is used to enhance a small signal sensitivity of the voltage regulator 30. The small signal enhancing switch 3131 is not the essential element and can be removed from the embodiment.

The dividing voltage $V_{HC}$ may be the pre-kick dividing voltage, such that the power supply 32 can output the stable input voltage VCC. The pre-kick dividing voltage $V_{HC}$ is smaller than a target voltage initially, and then grows up to the target voltage smoothly. When the standby mode starts up from the standby mode, the current consumption is very large, and if the pre-kick dividing voltage $V_{HC}$ is smaller than a target voltage initially, the power voltage switch 322 can be turned to provide the stable input voltage VCC without voltage dropping.

Figure 4:
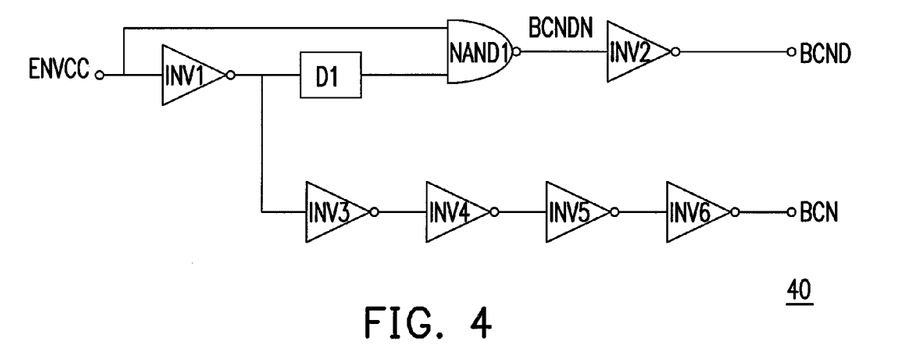
FIG. 4 is a circuit diagram of a control signal generator 40 according to an embodiment of the present invention.

Referring to FIG. 4, FIG. 4 is a circuit diagram of a control signal generator 40 according to an embodiment of the present invention. The voltage divider circuit 31 further comprises the control signal generator 40. The control signal generator 40 receives the power supply enable signal ENVCC, and generates the pull down control signal BCN and the control pulses BCND, BCNDN correspondingly, wherein the power supply 32 is enabled according to the power supply enable signal ENVCC, the pull down control signal BCN is an inversion of the power supply enable signal ENVCC, and a logic AND operation is performed on a delayed inversion of the power supply enable signal and the power supply enable signal to generate the control pulse BCND. The control signal generator 40 comprises invertors INV1-INV6, a delay circuit D1, a NAND gate NAND1. The power supply enable signal ENVCC passes the inverters INV1 and INV3-INV6 to form the pull down control signal BCN, and passes the inverter INV1 and the delay circuit D1 to form the delayed inversion of the power supply enable signal. The NAND gate NAND1 performs a logic NAND operation on the delayed inversion of the power supply enable signal and the power supply enable signal to form the control pulse BCNDN, and the control pulse BCNDN passes the inverter INV2 to form the control pulse BCND.

Figure 5:
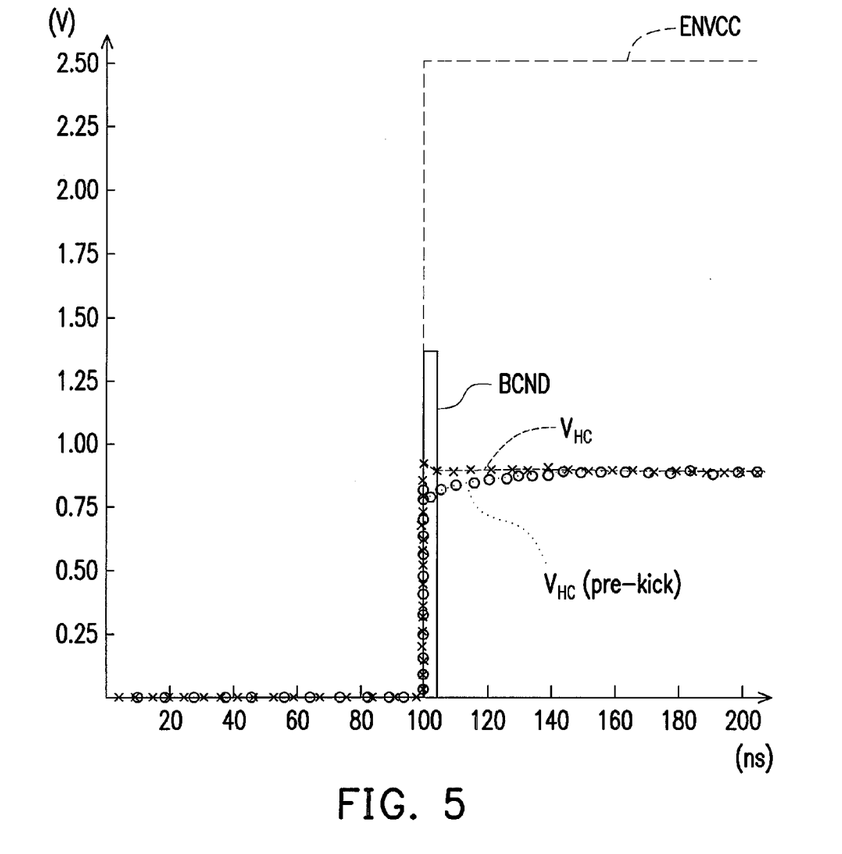
FIG. 5 is an oscillogram of the control pulse, power supply enable signal, and dividing voltage.

Referring to FIG. 5, FIG. 5 is an oscillogram of the control pulse, power supply enable signal, and dividing voltage. When the power supply signal ENVCC changes from the low level to the high level to start up the activating mode from the standby mode, the control pulse BCND will go to the high level for a short period $t_{PULSE}$, and the dividing voltage $V_{HC}$ or $V_{HC}$(pre-kick) will go to the target voltage (0.9V). As described above, the pre-kick dividing voltage $V_{HC}$(pre-kick) is smaller than the target voltage initially, and then smoothly grows up to the target voltage.

Figure 6:
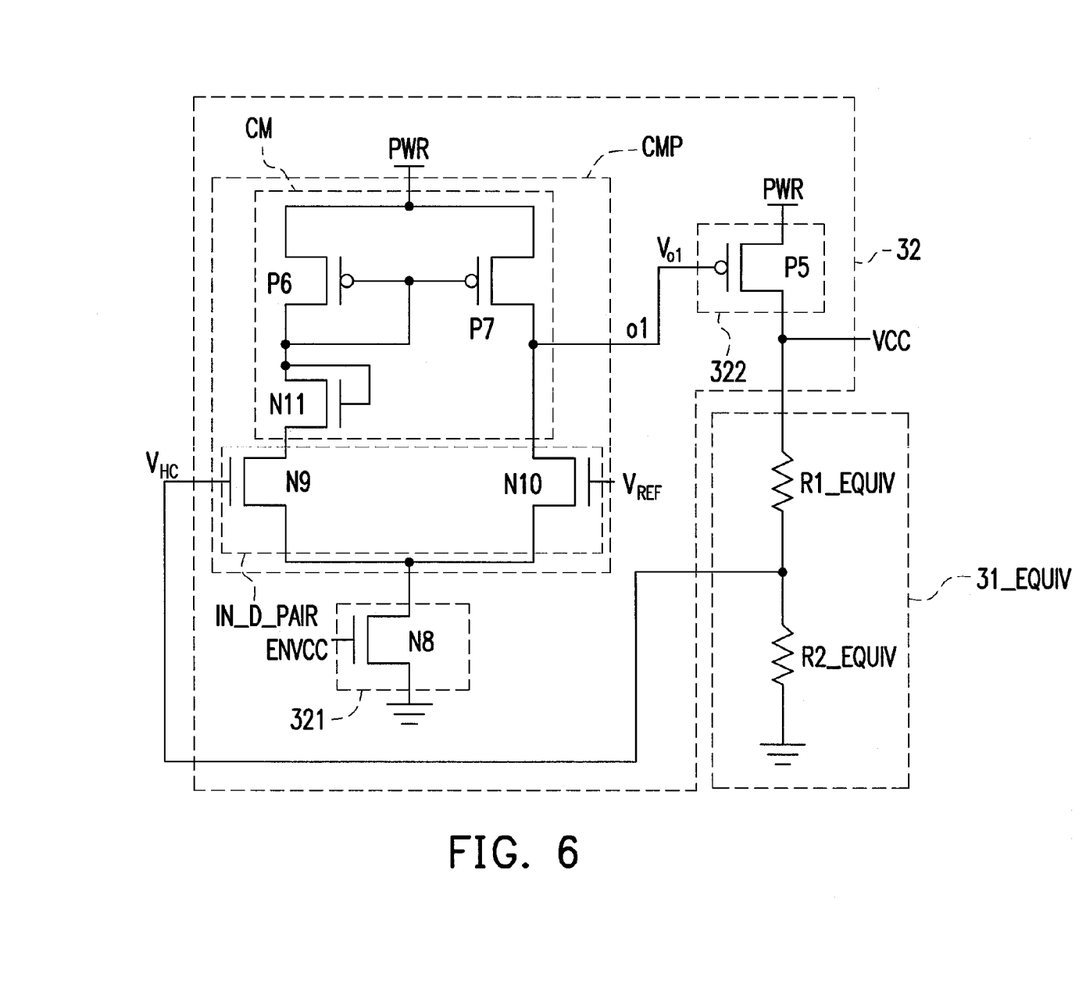
FIG. 6 through FIG. 9 are circuit diagrams of the comparator according to embodiments of the present invention.

Referring to FIG. 6 through FIG. 9, FIG. 6 through FIG. 9 are circuit diagrams of the comparator according to embodiments of the present invention. In FIG. 6, the comparator CMP comprises a current mirror CM, a differential input pair IN_D_PAIR. The voltage divider circuit 31 in the embodiment is models as the equivalent circuit 31_EQUIV comprising two equivalent resistors R1_EQUIV and R2_EQUIV. The current mirror CM for receiving the power voltage PWR is formed by two PMOS transistors P6, P7, and a NMOS transistor N11, and the differential input pair IN_D_PAIR for receiving the dividing voltage $V_{HC}$ and the reference voltage $V_{REF}$ is formed by two NMOS transistors N9 and N10. A first end of the current mirror CM is coupled to a first end of the differential input pair IN_D_PAIR, wherein the first end of the current mirror CM is coupled to the comparison result $V_{o1}$. A second end of the current mirror CM is coupled to a second end of the differential input pair IN_D_PAIR. In the embodiment, the range of the comparison result is from 0V through the power voltage PWR (i.e. $0 \leq V_{o1} \leq PWR$). Regarding a semiconductor process of 3.3V, the oxide stress of the power PMOS transistor P5 is 6.5 megaV/cm (3.6V/55 A, assuming the power voltage PWR is 3.6V, and the thickest oxide can allow 55 A of a passing current). The oxide stress may excess the oxide stress specified by the semiconductor process of 3.3V, and therefore the optical mask may be modified, which cause large mount of the extra cost.

Figure 7:
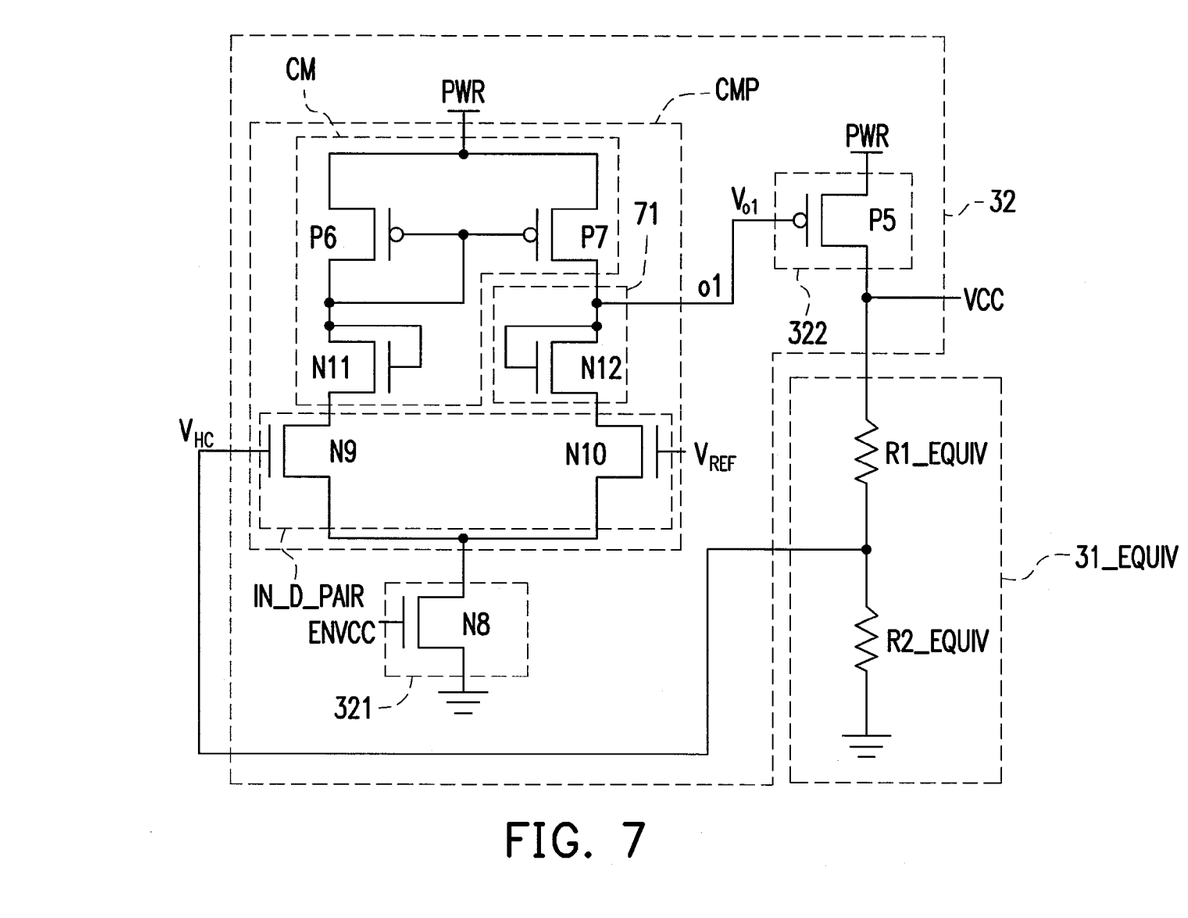

In FIG. 7, the comparator CMP is similar to that in FIG. 6, but additionally comprises auxiliary circuit 71 coupled between a first end of the current mirror CM and a first end of the differential input pair IN_D_PAIR, for providing a minimum voltage of the comparison result $V_{o1}$. The similar description related to the current mirror CM and the differential input pair IN_D_PAIR is omitted. In the embodiment, the auxiliary circuit 71 is a NMOS transistor N12, wherein a gate of the NMOS transistor N12 is coupled to a drain of the NMOS transistor N12, a source of the NMOS transistor N12 is coupled to the first end of the differential input pair IN_D_PAIR, and the drain of the NMOS transistor N12 is coupled to the first end of the current mirror CM. The minimum voltage of the comparison result $V_{o1}$ may be the threshold voltage $V_{th}$ of the NMOS transistor N12 (i.e. $V_{th} \leq V_{o1} \leq PWR$). Regarding a semiconductor process of 3.3V, the oxide stress of the power PMOS transistor P5 is 5.3 megaV/cm (3.6V-$V_{th}$)/55 A, assuming the power voltage PWR is 3.6V, and the thickest oxide can allow 55 A of a passing current). The oxide stress does not excess the oxide stress specified by the semiconductor process of 3.3V, and therefore the optical mask should not be modified, which reduce large mount of the extra cost.

Figure 8:
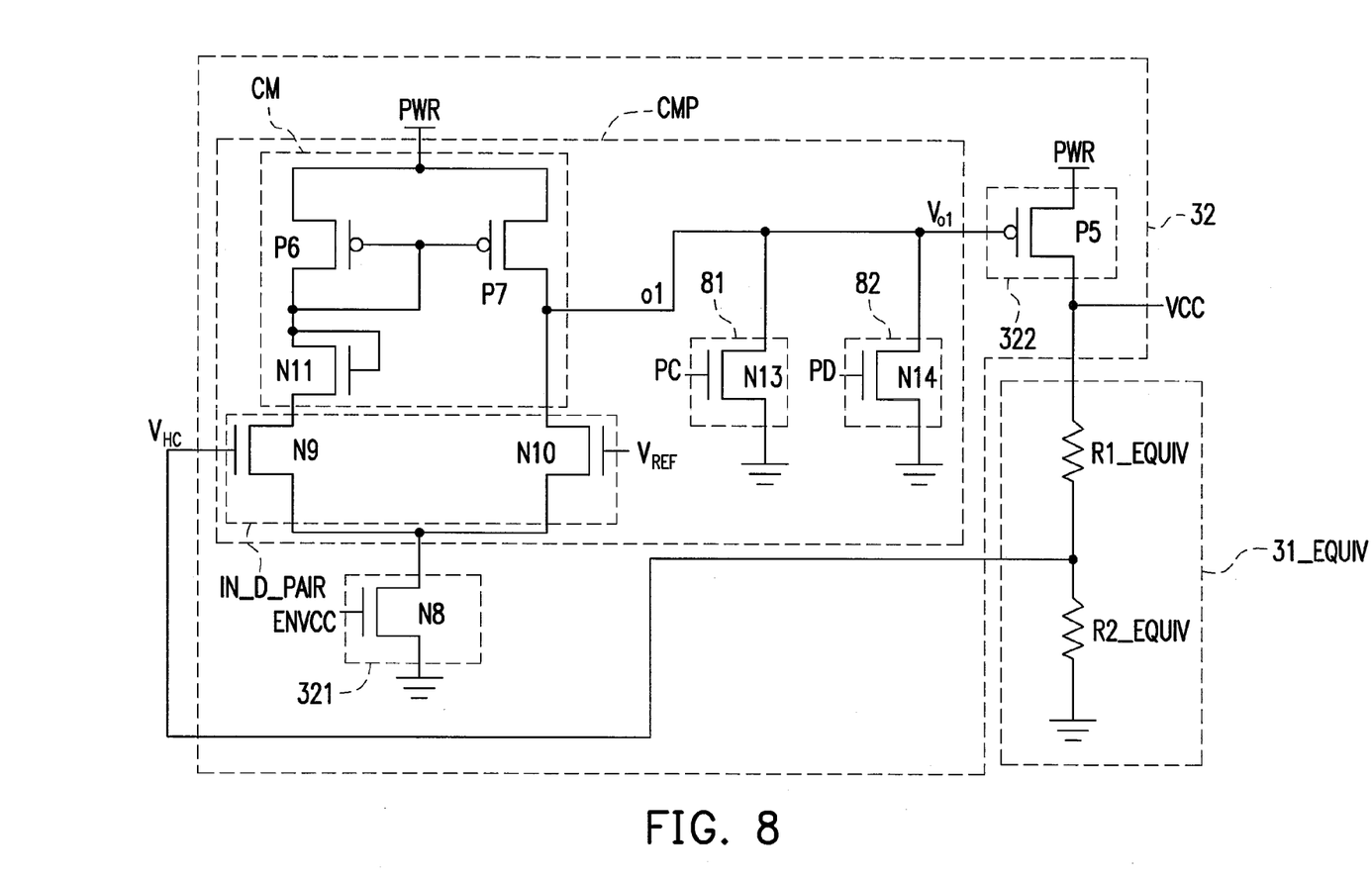

In FIG. 8, the comparator CMP is similar to that in FIG. 6, but additionally comprises switches 81, 82 respectively controlled by control pulse PC, PD, so as to provide the ground connected to the comparison result $V_{o1}$. The similar description related to the current mirror CM and the differential input pair IN_D_PAIR is omitted. Regarding a semiconductor process of 3.3V, the oxide stress of the power PMOS transistor P5 is 6.5 megaV/cm. The switches 81, 82 are implemented by NMOS transistor N13 and N14, and are used to help the equivalent voltage divider circuit 31_EQUIV to generate the pre-kick dividing voltage $V_{HC}$. The control pulse PC and PD can be the control pulse BCND.

Figure 9:
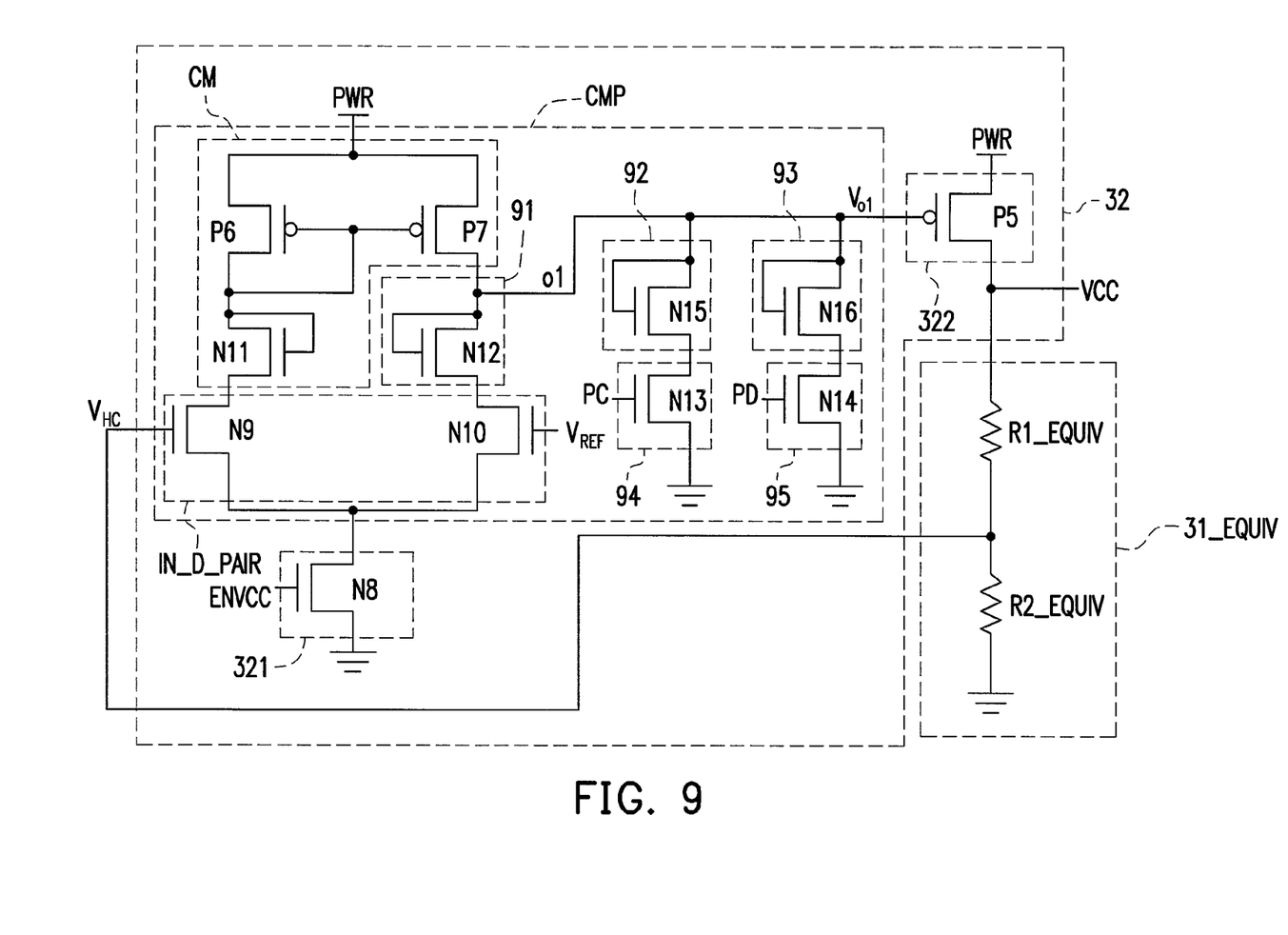

In FIG. 9, the comparator CMP is similar to that in FIG. 6, but additionally comprises auxiliary circuits 91-93 and the switches 94, 95, and the auxiliary circuit 91 is the same as the auxiliary circuits 71 in FIG. 7, therefore omitting the similar description. The auxiliary circuit 92 is coupled between the comparison result $V_{o1}$ and the switch 94 implemented by the NMOS transistor N13, and the auxiliary circuit 93 is coupled between the comparison result $V_{o1}$ and the switch 95 implemented by the NMOS transistor N14. The switch 94 is controlled by a control pulse PC to provide the ground connected to the auxiliary circuit 92 for the short period while the power supply 32 starts up to provide the input voltage VCC. The switch 95 is controlled by a control pulse PD to provide the ground connected to the auxiliary circuit 93 for the short period while the power supply 32 starts up to provide the input voltage VCC. The auxiliary circuits 91-93 provide the minimum voltage of the comparison result $V_{o1}$. The auxiliary circuits 92, 93 are respectively NMOS transistors N15, N16, wherein gates of NMOS transistors N14, N15 are respectively coupled to drains of the NMOS transistors N15, N16, sources the NMOS transistors N15, N16 are respectively coupled to the switches 94, 95, and the drains of the NMOS transistors N15, N16 are coupled to the comparison result $V_{o1}$. Regarding a semiconductor process of 3.3V, the oxide stress of the power PMOS transistor P5 is 5.3 megaV/cm. The switches 92, 93 are used to help the equivalent voltage divider circuit 31_EQUIV to generate the pre-kick dividing voltage $V_{HC}$. The control pulse PC and PD can be the control pulse BCND.

To sum up, the voltage divider circuit provided by the present invention has fast rising speed of the dividing voltage when an activating mode starts up, and thus the power supply for the voltage divider circuit can be shut down when the input voltage from the voltage divider circuit is not needed by the voltage divider circuit in a standby mode, so as to saving the undesired current consumption in the standby mode. Furthermore, the voltage divider circuit can output pre-kick dividing voltage to help the power supply to output a stable input voltage to the voltage divider circuit, and to reduce the cost of the semiconductor process.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:
1. A voltage regulator, comprising:
 a voltage divider circuit, comprising:
  a first PMOS transistor, a source thereof is coupled to an input voltage from a power supply, and a gate thereof is coupled to a drain thereof;
  a second PMOS transistor, a source thereof is coupled to the drain of the first PMOS transistor, and a gate thereof is coupled to a drain thereof;

a third PMOS transistor, a source thereof is coupled to the drain of the second PMOS transistor, a gate thereof is coupled to a drain thereof, and the drain thereof is coupled to a referencing voltage;

a first NMOS transistor, a source thereof is coupled to a drain thereof, a gate thereof is coupled to the source of the first PMOS transistor, and the drain thereof provides a dividing voltage;

a pull down circuit, comprising a plurality of switches controlled by a pull down control signal, and providing a ground connected to the sources of the first, second, and third PMOS transistors when the power supply is disabled to provide the input voltage; and a switching capacitor circuit, controlled by a control pulse, comprising a capacitor, and providing the capacitor connected to the dividing voltage for a short period while the power supply starts up to provide the input voltage; and the power supply, comprising:

a comparator, for comparing the dividing voltage and a reference voltage, and outputting a comparison result correspondingly; and a power voltage switch, controlled by the comparison result to provide the input voltage from a power voltage.

2. The voltage regulator according to claim 1, wherein the power supply further comprises:

a comparator enable switch, controlled by a power supply enable signal to provide the ground connected to the comparator.

3. The voltage regulator according to claim 1, wherein a positive input end of the comparator receives the dividing voltage, a negative input end the comparator receives the reference voltage, the power voltage switch is a power PMOS transistor, a source of the power PMOS transistor is coupled to the power voltage, a drain of the power PMOS transistor is coupled to the input voltage, and a gate of the power PMOS transistor is coupled to the comparison result.

4. The voltage regulator according to claim 1, wherein the comparator comprises:

a current mirror, for receiving the power voltage;

a differential input pair, for receiving the dividing voltage and the reference voltage;

a first auxiliary circuit, coupled between a first end of the current mirror and a first end of the differential input pair, for providing a minimum voltage of the comparison result;

wherein a second end of the current mirror is coupled to a second end of the differential input pair, and the first end of the current mirror is coupled to the comparison result.

5. The voltage regulator according to claim 4, wherein the first auxiliary circuit is a second NMOS transistor, a gate thereof is coupled to a drain thereof, a source thereof is coupled to the first end of the differential input pair, and the drain thereof is coupled to the first end of the current mirror.

6. The voltage regulator according to claim 5, wherein the comparator further comprises:

a second auxiliary circuit, coupled between the comparison result and a first auxiliary circuit switch;

a third auxiliary circuit, coupled between the comparison result and a second auxiliary circuit switch;

the first auxiliary circuit switch, controlled by a first control pulse to provide the to ground connected to the second auxiliary circuit for the short period while the power supply starts up to provide the input voltage; and the second auxiliary circuit switch, controlled by a second control pulse to provide the ground connected to the third auxiliary circuit for the short period while the power supply starts up to provide the input voltage;

wherein the first, second, and third auxiliary circuits provide the minimum voltage of the comparison result.

7. The voltage regulator according to claim 6, wherein the second and third auxiliary circuits are respectively a third and fourth NMOS transistors, gates of the third and fourth NMOS transistors are respectively coupled to drains of the third and fourth NMOS transistors, sources the third and fourth NMOS transistors are respectively coupled to the first and second auxiliary circuit switches, and the drains of the third and fourth NMOS transistors are coupled to the comparison result.

* * * * *